United States Patent [19]

Ingram et al.

[11] Patent Number: 5,562,781
[45] Date of Patent: Oct. 8, 1996

[54] AMORPHOUS, HYDROGENATED CARBON (A-C:H) PHOTOVOLTAIC CELL

[75] Inventors: David C. Ingram, Athens; Michael Maldei, Albany, both of Ohio

[73] Assignee: Ohio University, Athens, Ohio

[21] Appl. No.: 374,962

[22] Filed: Jan. 19, 1995

[51] Int. Cl.$^6$ .................... H01L 31/06; H01L 31/068; H01L 31/07; H01L 31/075; H01L 31/20
[52] U.S. Cl. .................... 136/249; 136/255; 136/258; 257/53; 257/54; 257/431; 257/440; 257/449; 257/458; 437/4; 437/101
[58] Field of Search ............... 136/249 TJ, 255, 136/258 AM; 257/53–55, 431, 440, 449, 458; 437/4, 101

[56] References Cited

U.S. PATENT DOCUMENTS

| | | | |
|---|---|---|---|
| 5,039,358 | 8/1991 | Birkle et al. | 148/33.3 |
| 5,055,421 | 10/1991 | Birkle et al. | 437/101 |
| 5,087,959 | 2/1992 | Omori et al. | 257/635 |
| 5,206,534 | 4/1993 | Birkle et al. | 257/464 |

FOREIGN PATENT DOCUMENTS 2-34975  2/1990  Japan ................ 136/258 AM

OTHER PUBLICATIONS

Veerasamy et al., "Photoresponse characteristics of n-type tetrahedral amorphous carbon/p-type Si heterojunction diodes", *Appl. Phys. Lett.*, vol. 64, No. 17, Apr. 25, 1994, pp. 2297–2299.

*Primary Examiner*—Aaron Weisstuch
*Attorney, Agent, or Firm*—Frank H. Foster; Kremblas Foster Millard & Pollick

[57] ABSTRACT

A photovoltaic cell comprising a plurality of film layers, at least one of the layers being a semiconductor film of amorphous, hydrogenated carbon. The preferred embodiment comprises a plurality of semiconductor films sandwiched together in layers, every three layers forming a PIN junction. All films are made of amorphous, hydrogenated carbon and vary only by dopant levels within each PIN junction. There are variations in bandgap from one PIN junction to the next in order that the photovoltaic effect in each PIN junction will be caused by a different portion of the spectrum of light.

27 Claims, 2 Drawing Sheets

AMORPHOUS, HYDROGENATED CARBON (A-C:H) PHOTOVOLTAIC CELL

TECHNICAL FIELD

The invention relates generally to photovoltaic cells, and specifically to cells made from thin film, amorphous semiconductors.

BACKGROUND ART

Solar energy is a promising source of power, but in part due to the expense of manufacturing devices which are able to convert solar energy into electrical energy, the economic feasibility of solar energy is presently limited. Thin films (layered upon one another to form photovoltaic cells) have recently become advantageous, but remain relatively expensive to manufacture due to the complex deposition process used with conventional materials. Additionally, degradation of electrical power output occurs over time in some conventional thin film photovoltaic cells such as amorphous silicon cells.

Amorphous silicon based thin films are made in groups of three films (trios) forming a PIN junction cell and in multiple layers of these trios forming a PIN multijunction cell. Multijunction thin film photovoltaic cells, such as those made of amorphous silicon, have semiconductor alloys of different composition forming each of the thin film trios making up the cell. The films have different compositions to enable each trio of the cell to have a bandgap different from the other trios. The difference in bandgap between trios enables each trio in a cell to absorb a different portion of the light spectrum, (i.e. a different range of photon energies). With conventional materials, however, the bandgap of the material of one film can only be made different from another film by varying the elemental composition of the films.

It is conventional to use silicon based materials to form a multijunction cell made up of three film layers in each PIN junction trio. The same silicon based material makes up each film in the trio and the films are doped to establish their p-type, n-type or intrinsic characteristics. The bandgap of the films within a trio is usually the same, but between trios, the bandgap is usually different for the reasons described above. The bandgap between trios differs by making one trio of a silicon based material with a specific bandgap, (e.g. silicon carbide (SIC)), the next trio of another silicon based material with a different bandgap (e.g. silicon) and the next trio of another silicon based material with a still different bandgap (e.g. silicon germanide (SiGe)). Each trio in this multijunction cell absorbs a different portion of the spectrum of light. Since each trio utilizes the energy of a different portion of the light spectrum, a broader spectrum of light is converted to electrical energy, and therefore efficiency and electrical output are increased in the photovoltaic cell. However, these advantages can only be realized by controlling and changing the chemical composition of the thin films from trio to trio during manufacture which is a technically complex task.

It is technically complex to change the type of thin film material during common manufacturing processes, such as physical vapor deposition, used to make such thin films. This process involves depositing an alloy material onto a substrate while changing dopants for each film within a trio, and then depositing a different alloy to make the films of the next trio. When this change in alloy is necessary, a different source of material must be used, and therefore the deposition chamber must have all of the previously deposited material removed.

In order to avoid the need to use different elemental compositions for each trio of semiconductors making up each PIN junction, it would be desirable to find a material having semiconductor characteristics making it suitable for use in a photovoltaic cell, and also having the capability of having its bandgap widely varied without requiring alloying. However, it is necessary that the material not have other characteristics which would make it unsuitable for use in a photovoltaic cell.

Such a single material used for all layers of a cell would need to have an optical bandgap variable over a wide range. Two films of the same material having different work functions and forming a rectifying contact can form a photovoltaic cell, but to form a multijunction cell, the bandgap generally has to be changed between trios. No material has been found that can be varied this way.

Despite the potential of amorphous, hydrogenated carbon for use in a photovoltaic cell, amorphous, hydrogenated carbon has never been used or suggested as useful as an active element in the voltage generating portion of a photovoltaic cell.

In U.S. Pat. No. 5,206,534 by Birkle et al., amorphous, hydrogenated carbon has been used in a photovoltaic cell in its undoped form. Although this reference teaches to use amorphous carbon in a photovoltaic cell, the amorphous carbon film is passive, i.e. not an active charge carrier generating element. The photoexcited charge carriers are most likely produced in the monocrystalline GaAs or InP. Additionally, the efficiency of the cell is not mentioned.

In "Photoresponse characteristics of n-type tetrahedral amorphous carbon/p-type Si heterojunction diodes" by Veerasamy et al. (Appl. Phys. Lett., Vol. 64, No. 17, Apr. 25, 1994, pp. 2297–2299), the author describes the use of tetrahedral, non-hydrogenated amorphous carbon (also called amorphous diamond and amorphic diamond) as an active element in a photovoltaic cell. However, the tetrahedral amorphous carbon has no hydrogen in it, and this results in chemical and thermodynamic differences between tetrahedral amorphous carbon and amorphous, hydrogenated carbon.

There are problems associated with using amorphous, hydrogenated carbon as anything other than a conductive substrate or container for enclosing the materials which contribute to the current. Problems with amorphous, hydrogenated carbon making it unsuitable for use as an element which contributes to current generated by a photovoltaic cell are seemingly insurmountable, based on the prior art. For example, there are too many defect sites in the amorphous, hydrogenated carbon structure to make it a suitable material for a photovoltaic cell. Additionally, the lifetime of the minority carriers has been found to be too short. Furthermore, carbon has single, double, and triple bonds in its different morphologies which makes it very complicated, and therefore less likely to have the ability to exhibit photovoltaic characteristics. It is less likely that amorphous, hydrogenated carbon would exhibit photovoltaic characteristics due to the type of interatomic bonds, as is illustrated by examining a common photovoltaic material: silicon. The bonding of silicon, which is tetragonal, is critical to the material's ability to exhibit photovoltaic characteristics. Since carbon can have different bonds than silicon, it would seem less likely that amorphous, hydrogenated carbon would exhibit photovoltaic characteristics.

Amorphous, hydrogenated carbon would seem to be desirable for use in active semiconductor devices. However, scientists have attempted to use amorphous, hydrogenated carbon in this capacity and they have found substantial problems with it. However, it would be desirable, if these problems could be overcome, to use amorphous, hydrogenated carbon in a photovoltaic cell due to the unique advantages it possesses.

BRIEF DISCLOSURE OF INVENTION

The invention is an improved photovoltaic cell having first and second connected films. The films have different work functions as to yield a rectifying contact, and the improvement comprises at least one of the films comprising amorphous, hydrogenated carbon capable of contributing to the current generated by the cell.

The invention also contemplates a method of making a photovoltaic cell using an amorphous, hydrogenated carbon structure in the generation of current in a photovoltaic cell circuit. This method comprises forming a first film comprising amorphous, hydrogenated carbon adjacent a second film having a different work function, to create a junction between the two films. The method further comprises connecting an electrical circuit from one film to the other and exposing the films to light.

Amorphous, hydrogenated carbon is a material which has a bandgap which is largely variable without alloying. Carbon atoms can form three different types of bonding configurations, caused by hybridization of different atomic orbitals leading to a widely variable bandgap. As described by Robertson, J., Advances In Physics, 35, 317 (1986), the $sp^3$ configuration leads to the formation of a $\sigma$ bond between carbon atoms. $Sp^2$ hybridized carbon atoms form a $\sigma$ and a $\pi$ bond. The $sp^1$ configuration forms one $\sigma$ and two $\pi$ bonds. The ratio of $sp^2$ to $sp^3$ bonding can be varied for amorphous, hydrogenated carbon through variation in deposition conditions, and is strongly related to the bandgap of the deposited material. The bandgap of amorphous, hydrogenated carbon has been varied by researchers from 0.2 eV to 4.1 eV.

The existence of a $\pi$ bond in amorphous carbon is the sole reason why it is possible to change the bandgap through deposition conditions. This is an advantage over amorphous silicon and amorphous germanium because these materials can form only $\sigma$ bonds. In order to change the bandgap in amorphous silicon and amorphous germanium, they need to be alloyed in various compositions.

Figure 1:
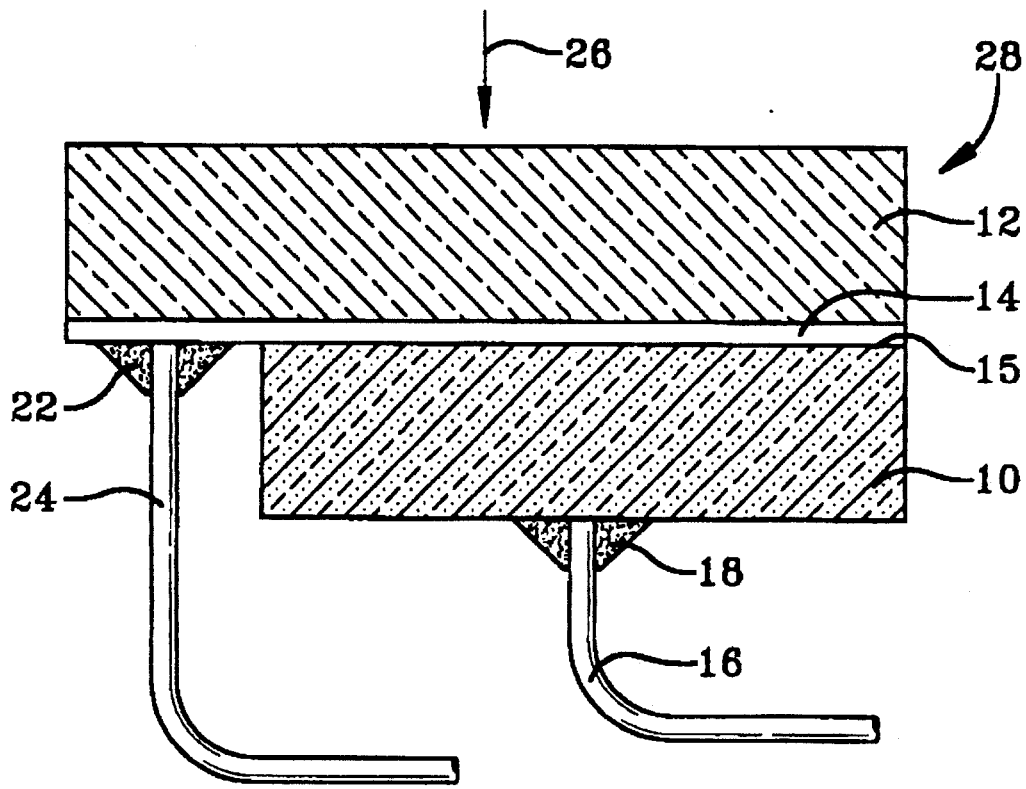
FIG. 1 is a side view in section illustrating an embodiment of the present invention.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art. In addition, many circuits are illustrated which are of a type which perform well known operations on electronic signals. Those skilled in the art will recognize that there are many, and in the future may be additional, alternative circuits which are recognized as equivalent because they provide the same operations on the signals.

DETAILED DESCRIPTION

As an introduction, it is to be noted that amorphous, hydrogenated carbon is defined for the purposes of this invention as carbon atoms combined to have an amorphous structure, with some hydrogen atoms incorporated within the amorphous carbon structure. The term "hydrogenated" does not imply that hydrogen must be intentionally added to the amorphous carbon structure during the deposition process. "Hydrogenated" is merely a term of art recognizing that the amorphous carbon used in the present invention generally has, for all practical purposes, some amount of hydrogen within its structure caused, for example, by the background pressure during the deposition process. In the preferred embodiment of the present invention hydrogen is added to the carbon structure in order to vary characteristics of the resulting structure. For example, hydrogen is added to saturate dangling bonds, increase the ratio of $sp^3/sp^2$ bonds and therefore increase optical bandgap. However, the term "amorphous, hydrogenated carbon" and the description of adding hydrogen, are not meant to imply that hydrogen must always be intentionally added during the manufacture of the amorphous, hydrogenated carbon film.

Furthermore, the necessary elements of photovoltaic cells can have a wide variety of configurations. Because of the large number of different configurations in which photovoltaic cells can be made, no effort will be made to describe every possible configuration. The inventors have experimented with multiple configurations, some of which will be described. In general, however, the basic optical and electrical characteristics exhibited by photovoltaic cells apply to each configuration as is understood by one skilled in the art.

In one type of photovoltaic cell configuration (similar to that disclosed in Carlson, D. E., IEEE Transactions on Electron Devices, 24,449 (1977)) shown in FIG. 1, a thin amorphous, semiconductor film 10 is deposited on indium tin oxide (ITO) coated glass 12. The embodiment of FIG. 1 lacks some of the parts of Carlson, and most significantly differs in the use of amorphous, hydrogenated carbon instead of amorphous silicon as the film 10 which contributes to the photogenerated current. When a material is described as "contributing to the current", this means that the material is an active component in the photovoltaic effect, helping to produce the generated voltage across the photo cell. Electrons, in a material which contributes to the current, are excited from the valence band to the conduction band by light which is incident upon the material. This excitation of electrons from one band to the other allows current to be generated. Materials used in the photo cell as insulators or conductors do not contribute to the current generated.

The cell 28 shown in FIG. 1 is a simple photovoltaic cell embodying the general photovoltaic cell principles which are known in the art. For example, the intrinsic semiconducting carbon film 10 and ITO layer 14 (wide bandgap semiconductor) have a difference in work function, and a depletion zone is formed at the junction 15 forming a rectifying contact. When light 26 is incident upon the cell 28, electrons are excited into the conduction band of the amorphous, hydrogenated carbon layer 10 leaving electron holes in the valence band of the layer 10. The difference in work functions creating an internal electrostatic field causes electrons to flow in one direction opposite to the direction of the electric field across the depletion zone 15, and causes holes to flow in the opposite direction across the depletion zone 15. This flow of electrons and holes caused by an electric field at the interface of layers 10 and 14 can be utilized to produce electrical current in an external circuit. The use of amorphous, hydrogenated carbon as the film which contributes to the generation of minority carrier current is new.

The carbon film 10 is doped with nitrogen and is deposited onto the ITO layer 14 by a conventionally known thin film deposition process, such as electric arc evaporation of a graphite rod described below. Copper wires 16 and 24 are attached to the carbon film 10 and ITO layer 14 with graphite glue 18 and 22, respectively. The carbon film 10 is approximately 2500 Angstroms thick, although different thicknesses may be more desirable depending on the amount of light that will be absorbed, strength desired, effect of thickness on adhesion, width of the depletion zone, level of doping, etc.

Figure 2:
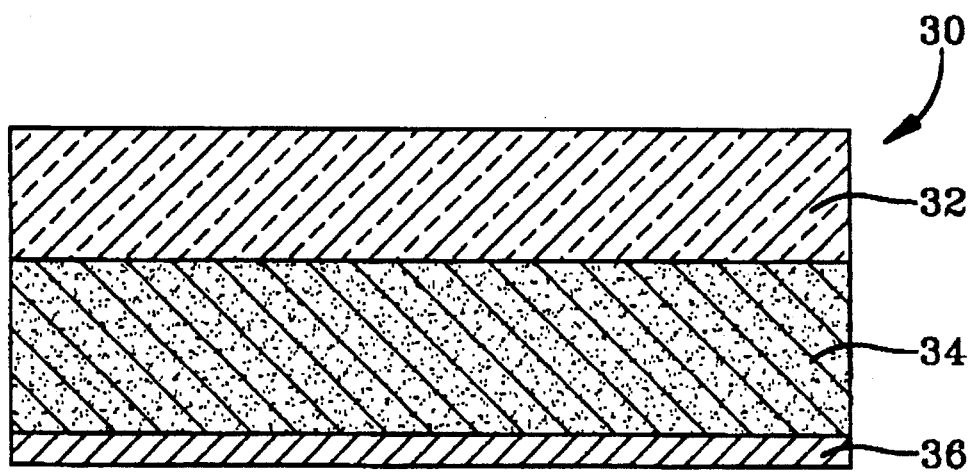
FIG. 2 is a side view in section illustrating a Schottky junction embodiment of the present invention.

FIG. 2 illustrates a different cell configuration showing a photovoltaic cell 30 comprising a metal back contact 36 on which an amorphous, hydrogenated carbon film 34 has been deposited. A partially transparent metal film 32 has been deposited onto the carbon film 34 forming a Schottky contact. The choice of the metal back contact should result in an ohmic contact to the amorphous, hydrogenated carbon film 34. This cell 30 illustrates the use of amorphous, hydrogenated carbon in a Schottky junction structure.

The cell 30 of FIG. 2 is an example of another possible configuration of a photovoltaic cell in which the present invention can be used. The cell 30 functions in a way that a person of ordinary skill in the art will understand when the doped or undoped carbon film 34 and the transparent metal film 32 have different work functions yielding a rectifying junction.

Figure 3:
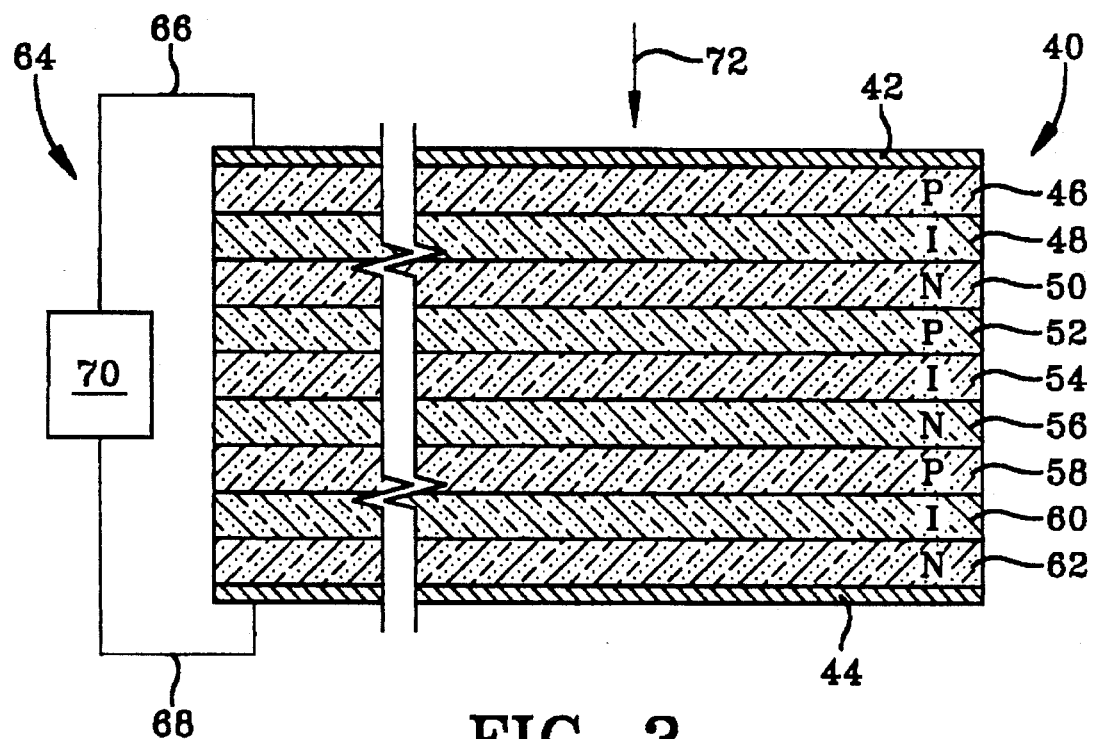
FIG. 3 is a side view in section illustrating the preferred embodiment of the present invention.

The preferred embodiment of the present invention is illustrated in FIG. 3. Photovoltaic cell 40 is made up of a plurality of layers 46–62 of semiconductors sandwiched between a conductive oxide (e.g. ITO) front contact 42 and an aluminum back contact 44 or other metal forming an ohmic contact.

The layers 46–62 are alternating p-type, intrinsic or lightly doped, and n-type amorphous, hydrogenated carbon films arranged in trios to form multiple PIN junctions, connected together to form a multijunction PIN cell. (It may also be desirable to construct a single PIN junction photovoltaic cell, but the PIN multijunction is preferred.) The dominant charge carrier type of each semiconductor film shown in FIG. 3 is denoted on the right side of each layer by the letters P, I, and N.

The interaction between the layers 46–62 will be understood by one familiar with existing configurations similar to cell 40. Light 72 incident upon the cell 40 causes the flow of majority and minority carriers as in conventional multijunction PIN photovoltaic cells. An electrical circuit 64 is connected to the front contact 42 and the back contact 44 by a pair of wires 66 and 68 which connect to a load 70.

The cell 40 differs from existing multijunction PIN photovoltaic cells in that all of the layers 46–62 which contribute to the electrical current generated by the cell 40 are made of a single material. The single material is amorphous, hydrogenated carbon which is doped to make each particular layer p-type, intrinsic (undoped or only slightly doped) or n-type.

The preferred embodiment shown in FIG. 3 is constructed by physical vapor deposition of each layer 42–62 on a substrate. The preferred deposition process is filtered, cathodic electric arc evaporation from graphite, graphite and boron, and graphite and phosphorus targets. However, other processes such as glow discharge, unbalanced DC magnetron sputtering or laser evaporation may be used. During the preferred process, an arc is formed between two electrodes, preferably both of which are the carbon source, such as graphite. As the arc is formed between the two graphite (or graphite plus a dopant) electrodes, carbon ions and aggregates of carbon atoms are released. All particles except the carbon ions are filtered by a magnetic filter which removes neutral and macro- particles from a heated plasma stream. Carbon ions are accelerated toward a substrate due to a potential difference between the electrodes and the substrate. Since the source of carbon is graphite, hydrogen is preferably added.

In the preferred embodiments of the present invention, dopant elements (such as nitrogen, phosphorus, and boron) are selectively introduced into the stream of ions impinging onto the substrate during deposition in order to incorporate dopant atoms into the amorphous, hydrogenated carbon film. Some dopant elements (e.g. boron and phosphorus) can be mixed with the carbon source or can be supplied as gases (e.g. phosphine ($PH_3$) or diborane ($B_2H_6$)). However, nitrogen ($N_2$) can only be introduced as a gas in most processes. The dopant and the amount of dopant are selected for each layer 46–62 of the cell 40 depending on whether a p-type, intrinsic or n-type layer is being deposited. The dopant concentration is generally not changed from a selected type film of one trio to the same type film of another trio.

The cell 40 is preferably made up of a plurality of carbon film trios forming PIN junctions (three trios are shown in FIG. 3 as an example). Each semiconductor in a trio of films forming a PIN junction (e.g. the trio made up of layers 46, 48 and 50) preferably has substantially the same bandgap. Furthermore, each trio of layers preferably has a different bandgap than all other trios. This is for the purpose, described earlier, of making each trio absorb a different portion of the light spectrum.

It is possible to make the layers of each trio have substantially the same bandgap as the layers of all other trios. One reason to make each trio in a PIN multijunction cell have the same bandgap is to reduce the necessary thickness of each trio if the charge carriers have a very short lifetime. Since the lifetime of charge carriers generated in the intrinsic layer is longer than in the n-type or the p-type layers, it is desirable to have more charge carriers generated in the intrinsic layer. When multiple trios of the same bandgap films are connected together in a cell, the thickness of the intrinsic layer can be reduced which will result in a higher electric field in the intrinsic layers.

It is also possible, with a PIN multijunction such as that shown in FIG. 3, to make a heteroface cell by having the top p-type layer 46 of the multijunction cell 40 have an exceptionally large bandgap. This large bandgap top layer allows photons to pass through to the first intrinsic layer 48 with little or no absorption of the photon energy. The heteroface cell results in the layer 46 having a different bandgap than the other layers (48 and 50) within the trio containing layer 46. In general, the layers within a trio of the preferred embodiment will have the same bandgap, but the heteroface cell is understood to be one of many possible advantageous exceptions to this general rule, and goes unstated in portions of this description because it is a commonly known exception.

The bandgap of an amorphous, hydrogenated carbon film can be changed by changing one or more parameters during the deposition process. Deposition parameters which vary the bandgap in amorphous, hydrogenated carbon include the kinetic energy of the ionized particles which impinge upon the substrate surface. Kinetic energy can be varied by varying the voltage between the source of carbon and the substrate. Generally, an increase of bias voltage leads to a decrease of the bandgap. One researcher's work has shown an increase from 100 to 1000 volts to decrease the bandgap from about 2.1 eV to 1.0 eV, but the amount of change depends on the characteristics of the experimental equipment. The extreme limits of bias voltage used will vary by deposition method and have not been fully determined by experimentation, but in the preferred embodiment voltage can be varied at least between 10 and 1,000 volts. With an increase in bias voltage, carbon ions attain a higher kinetic energy when impinging on the substrate surface. This energy is dissipated locally in the growing film and a higher $sp^2/sp^3$ ratio is obtained through graphitisation.

Another deposition parameter which varies the bandgap is the temperature of the substrate onto which the carbon is deposited. Experiment has shown that an increase in substrate temperature results in a decrease in the bandgap.

A third deposition parameter is the amount of hydrogen present during deposition. For example, increasing the amount of hydrogen in the deposition chamber widens the optical bandgap. The increase in bandgap by varying hydrogen is attributed to two distinctive mechanisms. The first is the passivation of dangling bonds by hydrogen, and the second is the hydrogenation of unsaturated bonds yielding an enhancement of $sp^3$ bonding. See Jansen, F., et al., J. Vac. Sci. Technol. A, 3, 605 (1985). The density of defect states in amorphous, hydrogenated carbon is also substantially affected by the degree of hydrogenation. In amorphous silicon, the incorporation of hydrogen only leads to a removal of defect states and thus to an increase in bandgap.

Since each trio forming a PIN junction preferably has a different bandgap (except in the heteroface cell and other exceptions), each trio absorbs a different portion of the spectrum of light 72 which is incident upon the cell 40. For example, the trio made up of layers 46, 48, and 50 absorbs photons of higher energy than the trio made up of layer 52, 54, and 56. This selected absorption of photon energies in each trio of layers of the cell 40 allows the cell 40 to utilize the energy in a wide spectrum of light, thereby optimizing the electrical output and increasing the conversion efficiency.

As described above, differences in bandgap between trios of layers making up each PIN junction are desired in order to increase the device's efficiency. It is not necessary to alloy each layer 46–62 of the cell 40 in order to vary the bandgap of that layer. Alloying is conventionally necessary to vary bandgap from trio to trio, but with amorphous, hydrogenated carbon it is not necessary. To vary the bandgap, one need only vary the deposition parameters described above. This method of varying bandgap is substantially simpler than varying the composition of an alloy between deposition steps.

All of the layers 46–62 of the preferred embodiment are made of amorphous, hydrogenated carbon and contribute to the current generated. This makes manufacturing simpler and therefore less expensive than manufacture of previous photovoltaic devices since there is no need to vary the composition of alloyed materials in order to vary the bandgap. Furthermore, there is no known light induced degradation in the electrical power output of amorphous, hydrogenated carbon cells, whereas conventional materials are subject to a substantial decrease in conversion efficiency.

Amorphous, hydrogenated carbon films exhibit very high absorption coefficients compared to other semiconductor materials. The higher the absorption coefficient, the thinner a photovoltaic cell can be made, resulting in material and production time savings. The preferred thickness of each amorphous, hydrogenated carbon film has not been determined, but thicknesses in the range of 100 to 5,000 Angstroms have been found to be satisfactory. The thickness of the intrinsic layer of each PIN junction must be optimized (e.g. by increasing thickness with depth in the cell) so each PIN junction trio produces the same output current. The resistivity of the amorphous, hydrogenated layer of the preferred embodiment is in the range of 0.1 $\Omega$.cm to $1\times10^9$ $\Omega$.cm.

Figure 4:
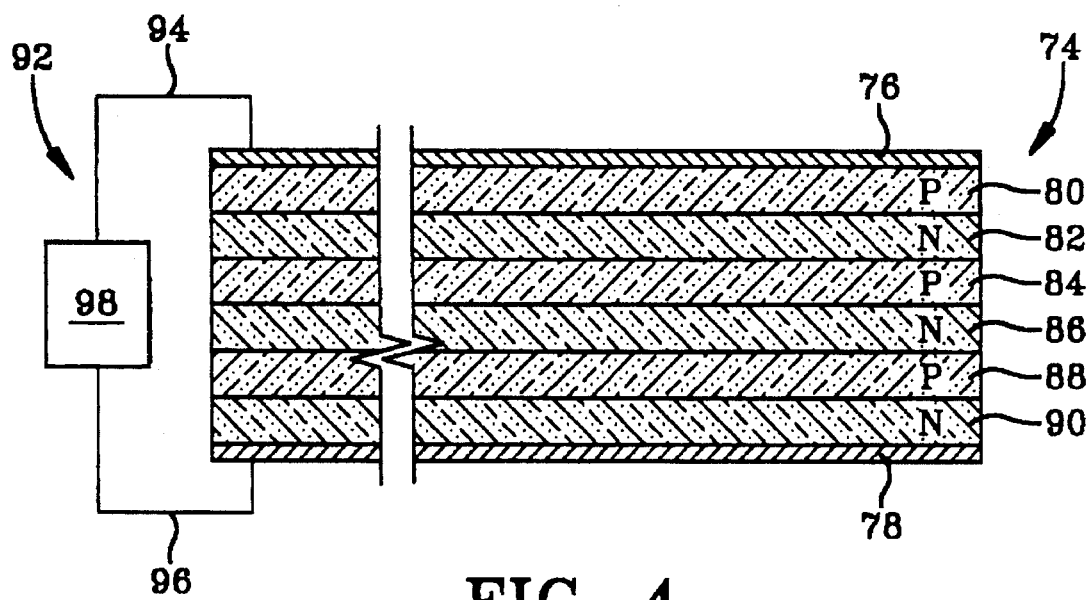
FIG. 4 is a side view in section illustrating an alternative embodiment to the present invention.

It is possible to make a multilayer, p-n junction photovoltaic cell using the present invention, as illustrated in FIG. 4. The cell 74 of FIG. 4 is made up of a front contact 76 and a back contact 78, with multiple alternating layers 80–90 of p-type and n-type amorphous carbon semiconductor films. An external circuit 92 is connected by a first wire 94 and a second wire 96 to the contacts 76 and 78 respectively. A load 98 is connected to the wires 94 and 96.

The electrons which are excited by the light incident upon a photovoltaic cell have a lifetime before they combine with holes which are left behind in the valence band when the electrons are excited to the conduction band. In amorphous, hydrogenated carbon, the lifetime of these electrons appears to be short based on the inventors' experimentation to date. Due to the short lifetime of electrons in amorphous, hydrogenated carbon, it is preferred to have as many junctions as is practical in order to increase the efficiency of the photovoltaic cell. This is because the thickness of the intrinsic layer can then be reduced, which results in a higher electric field in the intrinsic layer. The p-n junction photovoltaic cell is only preferred, therefore, for low resistivity material, while a PIN junction cell is preferred for high resistivity material such as amorphous, hydrogenated carbon. In a PIN junction cell, there is an electric field over the entire intrinsic layer instead of at the semiconductor interface only as in a p-n junction cell.

The preferred structural design of the photovoltaic cell is based on electronic properties, such as the diffusion length of charge carriers. In crystalline photovoltaic cells the diffusion length is sufficiently large, but in amorphous materials the transport of charge carriers needs to be aided by an electric field. Therefore, determining what structural design of photovoltaic cells will involve studying these electronic principles to determine which design provides the optimum performance for amorphous, hydrogenated carbon.

While certain preferred embodiments of the present invention have been disclosed in detail, it is to be understood that various modifications may be adopted without departing from the spirit of the invention or scope of the following claims.

We claim:

1. An improved photovoltaic cell having first and second films in contact, the films having different work functions and forming a rectifying junction, the improvement comprising at least one of the films comprising a doped amorphous, hydrogenated carbon semiconductor contributing to current produced by the cell.

2. A photovoltaic cell in accordance with claim 1, wherein the other of the two films is a metal film.

3. A photovoltaic cell in accordance with claim 1, wherein the second of the two films is a second semiconductor also comprising doped amorphous, hydrogenated carbon.

4. A photovoltaic cell in accordance with claim 3, wherein the first semiconductor film is p-type and the second semiconductor film is n-type.

5. A photovoltaic cell in accordance with claim 4 wherein the cell further comprises a plurality of p-type and n-type semiconductor films alternately layered forming, a plurality of connected p-n junctions.

6. A photovoltaic cell in accordance with claim 4, wherein an intrinsic semiconductor film comprising amorphous, hydrogenated carbon is intermediate to the p-type and n-type semiconductor films, forming a trio of films which comprise PIN junction.

7. A photovoltaic cell in accordance with claim 6, wherein the cell further comprises a plurality of p-type, intrinsic and n-type semiconductor films forming a plurality of connected film trios which comprise PIN junctions.

8. A photovoltaic cell in accordance with claim 7 wherein a photovoltaic effect at each of the plurality of film trios is caused by a portion of the spectrum of light.

9. A photovoltaic cell in accordance with claim 8, wherein a p-type film, upon which light is incident prior to being incident upon any other active film of the cell, has a substantially larger bandgap than other films of the trio containing said p-type film and of any other trio, for forming a heteroface photovoltaic cell.

10. A photovoltaic cell in accordance with claim 8 wherein the bandgap of the semiconductors within each trio of films is substantially the same, and wherein the bandgap of the semiconductors of each trio of films differs from the bandgap of the semiconductors of all other trios of films, whereby photovoltaic effects at each PIN junction are caused by a portion of the spectrum of light, said portion being different for each trio of films.

11. A photovoltaic cell in accordance with claim 10, wherein the dopant used to dope at least one of the films is nitrogen.

12. A photovoltaic cell in accordance with claim 10, wherein the dopant used to dope at least one of the films is phosphorus.

13. A photovoltaic cell in accordance with claim 10, wherein the dopant used to dope at least one of the films is boron.

14. A method of using an amorphous, hydrogenated carbon structure to contribute to the generation of current in a photovoltaic cell, the method comprising:
   (a) forming a first semiconductor film comprising doped amorphous, hydrogenated carbon adjacent a second film having a different work function, forming a rectifying junction between the two films;
   (b) connecting an electrical circuit from one film to the other; and
   (c) exposing the films to light.

15. A method in accordance with claim 14, wherein the second film comprises a metal.

16. A method in accordance with claim 14, wherein the second film comprises a doped semiconductor.

17. A method in accordance with claim 16, wherein the second film comprises doped amorphous, hydrogenated carbon.

18. A method in accordance with claim 17, wherein the first film is a p-type semiconductor and the second film is an n-type semiconductor.

19. A method in accordance with claim 18, wherein the method further comprises interposing electrically connecting an intrinsic amorphous, hydrogenated carbon semiconductor film between the first and second films, thereby forming a trio of films which comprise a PIN junction.

20. A method in accordance with claim 17, wherein the method further comprises electrically connecting a plurality of trios of films, forming a PIN multijunction.

21. A method of making a photovoltaic cell, comprising:
   (a) forming a first semiconductor film comprising doped amorphous, hydrogenated carbon contributing to current generated by the cell, said first film being adjacent a second film having a different work function, thereby forming a rectifying junction between the films; and
   (b) connecting an electrical circuit from one film to the other.

22. A method in accordance with claim 21, wherein the second film comprises a metal.

23. A method in accordance with claim 21, wherein the second film comprises a doped semiconductor.

24. A method in accordance with claim 23, wherein the second film comprises doped amorphous, hydrogenated carbon.

25. A method in accordance with claim 24, wherein the first film is a p-type semiconductor and the second film is an n-type semiconductor.

26. A method in accordance with claim 25, wherein the method further comprises interposing an intrinsic amorphous, hydrogenated carbon semiconductor film between the first and second films, thereby forming a trio of films which comprise a PIN junction.

27. A method in accordance with claim 26, wherein the method further comprises connecting a plurality of trios of films, thereby forming a PIN multijunction.

* * * * *

UNITED STATES PATENT AND TRADEMARK OFFICE
CERTIFICATE OF CORRECTION

PATENT NO. : 5,562,781
DATED : October 8, 1996
INVENTOR(S) : Ingram et al.

It is certified that error appears in the above-indentified patent and that said Letters Patent is hereby corrected as shown below:

Column 3, line 30, delete "35" and insert --35--.

Column 4, line 44, delete "24,449" and insert --24, 449--.

Column 7, line 33, delete "3" and insert --3--.

Column 8, line 16, delete "$\Omega$.cm" and insert --$\Omega \cdot$cm--.

Column 8, line 17, delete "$\Omega$.cm" and insert --$\Omega \cdot$cm--.

Column 10, lines 17 & 18, delete "electrically connecting".

Signed and Sealed this

Fifth Day of August, 1997

Attest:

BRUCE LEHMAN

*Attesting Officer*  *Commissioner of Patents and Trademarks*